(12) United States Patent
Rao et al.

(10) Patent No.: US 8,699,281 B2
(45) Date of Patent: *Apr. 15, 2014

(54) SEMICONDUCTOR MEMORY DEVICE AND METHOD WITH AUXILIARY I/O LINE ASSIST CIRCUIT AND FUNCTIONALITY

(75) Inventors: Shetti Shanmukheshwara Rao, Bangalore (IN); Ankur Goel, Bangalore (IN)

(73) Assignee: Elpida Memory Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/550,783

(22) Filed: Jul. 17, 2012

(65) Prior Publication Data

US 2012/0281486 A1 Nov. 8, 2012

Related U.S. Application Data

(63) Continuation of application No. 12/543,262, filed on Aug. 18, 2009, now Pat. No. 8,259,509.

(30) Foreign Application Priority Data

Aug. 18, 2008 (IN) .......................... 1999/CHE/2008

(51) Int. Cl.
*G11C 7/10* (2006.01)

(52) U.S. Cl.
USPC ....................................... 365/189.05; 365/63

(58) Field of Classification Search
USPC .................. 365/189.05, 63, 205, 203
See application file for complete search history.

(56) References Cited

U.S. PATENT DOCUMENTS

| | | | |
|---|---|---|---|
| 5,621,679 | A | 4/1997 | Seo et al. |
| 6,034,913 | A | 3/2000 | Freimuth |
| 6,198,679 | B1 | 3/2001 | Nakasu et al. |
| 7,193,915 | B2 | 3/2007 | Mochida |
| 8,259,509 | B2 * | 9/2012 | Rao et al. ................. 365/189.05 |
| 2002/0015350 | A1 | 2/2002 | Tomishima et al. |
| 2002/0027818 | A1 | 3/2002 | Kato et al. |

FOREIGN PATENT DOCUMENTS

| | | |
|---|---|---|
| JP | 62-099988 A | 5/1987 |
| JP | 03-074722 A | 3/1991 |
| JP | 08-138377 A | 5/1996 |
| JP | 08-255479 A | 10/1996 |
| JP | 08-329685 A | 12/1996 |
| JP | 11-149769 A | 6/1999 |
| JP | 2003-007064 A | 1/2003 |
| JP | 2005-085289 A | 3/2005 |

OTHER PUBLICATIONS

Japanese Office Action dated Oct. 11, 2011 with a partial English translation.

* cited by examiner

*Primary Examiner* — Huan Hoang
(74) *Attorney, Agent, or Firm* — McGinn IP Law Group, PLLC (57) ABSTRACT

A semiconductor memory device includes an I/O line for transmitting read data that has been read from a memory cell, a plurality of driver circuits for driving the I/O line on the basis of the read data, a read circuit for receiving the read data transmitted through the I/O line, and an assist circuit for amplifying the read data transmitted through the I/O line. The assist circuit is disposed farther away from a prescribed drive circuit included in the plurality of drive circuits as viewed from the read circuit. The signal level can thereby rapidly change levels even in memories having relatively long I/O lines.

24 Claims, 11 Drawing Sheets

| CASE | WRIT | PRE | DATA | TRANSISTOR 301 | TRANSISTOR 302 |
|------|------|-----|------|----------------|----------------|
| #1   | H    | L   | H    | ON             | OFF            |
| #2   | H    | L   | L    | OFF            | ON             |
| #3   | L    | H   | -    | ON             | OFF            |
| #4   | L    | L   | -    | OFF            | OFF            |

SEMICONDUCTOR MEMORY DEVICE AND METHOD WITH AUXILIARY I/O LINE ASSIST CIRCUIT AND FUNCTIONALITY

This application is a Continuation application of U.S. patent application Ser. No. 12/543,262, filed on Aug. 18, 2009 now U.S. Pat. No. 8,259,509, which, in turn, claims priority to India Patent Application 1999/CHE/2008, filed on Aug. 18, 2008.

BACKGROUND OF THE INVENTION

1. Field of the Invention

The present invention relates to a semiconductor device having a signal transmission line therein and, more specifically, to a semiconductor memory device having a long I/O line as a signal transmission line. The present invention further relates to a method of driving such signal transmission line or I/O line.

2. Description of the Related Art

Synchronous memory typified by synchronous DRAM (Dynamic Random Access Memory) is widely used in personal computers and the like. Synchronous memory inputs and outputs data synchronously with clock signals supplied from a memory controller, thereby increasing the data transfer rate by using higher clock speeds.

Even in a synchronous DRAM, however, the DRAM core still operates in analog mode. Specifically, a very weak electric charge that is read from the memory cells is amplified by a sense amplifier and is then transmitted to a peripheral circuit area via a hierarchically structured system of I/O lines. It is therefore necessary not only to merely raise the clock frequency to increase memory speed but to also allow the read data that is read from the memory cells to be transmitted more rapidly to a peripheral circuit area in order to increase the data transfer rate.

Local I/O lines for transmitting read data within a memory cell area, as well as main I/O lines for transmitting read data from a memory cell area to a peripheral circuit area, are commonly used as the hierarchically structured I/O lines (See Japanese Patent Laid-open Nos. 2003-7064 and 2005-85289). Among these lines, the main I/O lines are often quite long, having considerable wiring length on the order of several millimeters and therefore take a long time to transmit read data.

Another consideration is that, when a main I/O line is relatively long, the transmission rate may differ considerably depending on the position of the driver circuit used to drive the main I/O line. Specifically, a signal waveform on the main I/O line may degrade and/or distort during transmission along the I/O line depending in part on the location of the driver circuit relative to the point on the I/O line at which the signal is applied, e.g., driver circuits located at a far end of an I/O line versus those located at a near end. Differences in transmission distances and signal degradation and distortion along the I/O line may result in a reduction in the signal quality of read data from the memory.

Such problems are more pronounced in cases in which the main I/O line is a single-ended I/O line. Unlike a differential I/O line in which two complementary signal wires or conductors are used, a single-ended I/O line is composed of a single signal wire. The number of wires can therefore be reduced but, because a single-ended I/O line requires greater electric potential variations than does a differential I/O line, the reduction in the transmission rate becomes more pronounced as the wiring length increases.

SUMMARY

In one embodiment of the invention, there is provided a semiconductor memory device comprising: a local I/O line receiving data out read from a memory cell; a main I/O line; a drive circuit driving the main I/O line in response to data on the local I/O line, a voltage change responsive to the data on the local I/O line thereby appearing on the main I/O line; and an assist circuit provided independently of the drive circuit, the assist circuit being connected to the main I/O line to amplify the voltage change on the main I/O line.

In another embodiment, there is provided a method comprising: transmitting data from a memory cell onto a local I/O line; driving, in response to the data transmitted onto the local I/O lines, a main I/O line; and supplementing the driving the main I/O line at a location on the main I/O line, which is different from a location on the main I/O line corresponding to a driving location from the local I/O line onto the main I/O line.

In still another embodiment, there is provided a semiconductor device comprising: a signal transmission line; a drive circuit driving the signal transmission line from a first level to a second level in response to a data signal supplied to the drive circuit; and an assist circuit responding to a change in potential on the signal transmission line and driving the signal transmission line from the first level to the second level in parallel to the drive circuit.

DETAILED DESCRIPTION OF THE PREFERRED EMBODIMENTS

Preferred embodiments of the present invention will now be explained in detail with reference to the drawings.

Figure 1:
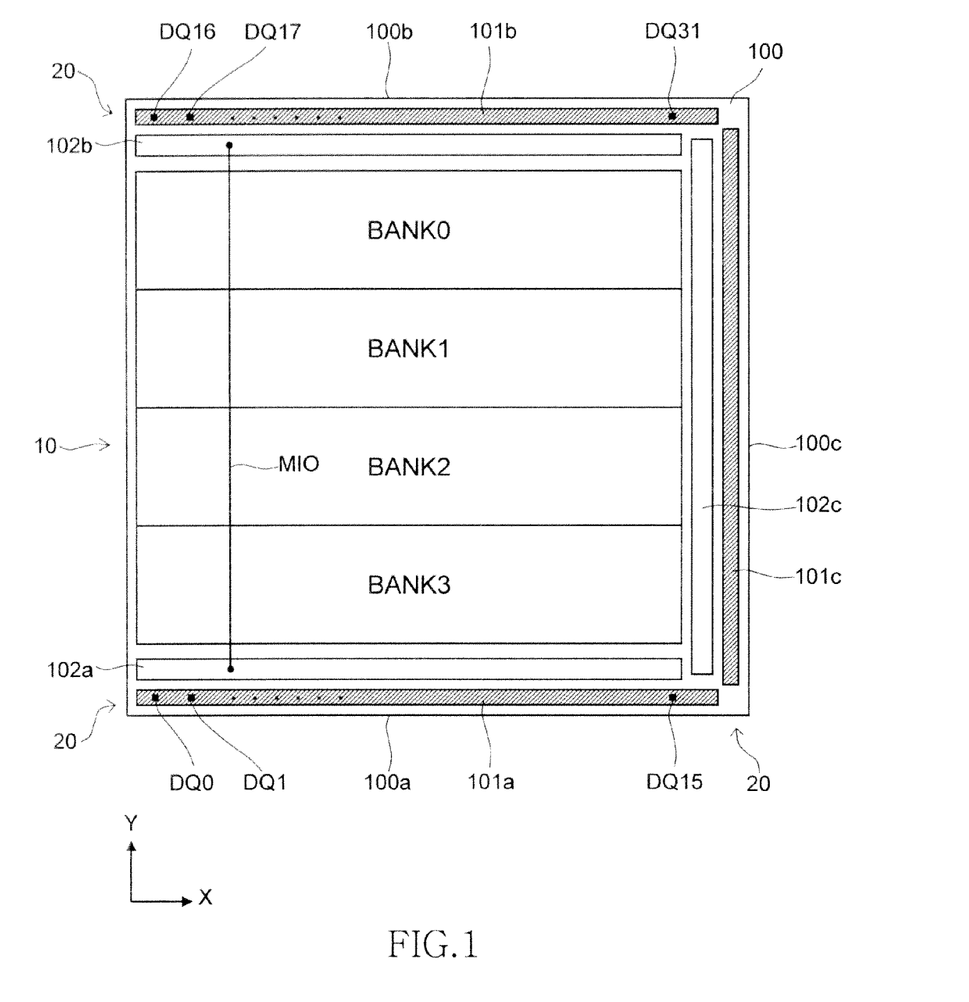
FIG. 1 is a schematic plan view showing the layout of a semiconductor chip of the semiconductor memory device according to a preferred embodiment.

FIG. 1 is a schematic plan view showing the layout of a semiconductor chip of the semiconductor memory device according to a preferred embodiment of the present invention. The present embodiment is one example of a case in which the present invention is applied to DRAM, but the applicable scope of the present invention is not limited thereby. For example, the configuration shown herein may be used in other arrays of circuits having relatively long lengths of I/O wiring including, but not limited to, other types of memories, logic circuits, processors, etc.

The semiconductor memory device according to the present embodiment is formed on a semiconductor chip 100 having a memory cell area 10 provided with four memory banks BANK0 to BANK3 and a peripheral circuit area 20 positioned on the periphery of the memory cell area 10, as shown in FIG. 1.

The peripheral circuit area 20 includes a pad area 101a and a first circuit area 102a disposed along a peripheral edge 100a of the semiconductor chip 100, a pad area 101b and a second circuit area 102b disposed along a peripheral edge 100b of the semiconductor chip 100, and a pad area 101c and a third circuit area 102c disposed along a peripheral edge 100c of the semiconductor chip 100.

Among the peripheral edge 100a to 100c of the semiconductor chip 100, the peripheral edge 100a and 100b are substantially parallel to each other, each extending in the X direction. (Note, the terms X and Y direction are used for ease of reference and are not intended to imply a particular orientation of semiconductor chip 100.) The peripheral edge 100c is substantially orthogonal to the peripheral edge 100a and 100b and extends in the Y direction. In many DRAMs, a pad area is provided in the center of the semiconductor chip, but it is difficult to locate the pad area in the center of the semiconductor chip in cases in which there is a considerable number of data I/O pins (e.g., 32 pins or more). A plurality of pad areas are provided to the peripheral edge portions of the semiconductor chip 100 in such cases, as shown in FIG. 1.

Half of the data I/O pins (DQ 0 to DQ 15 in the example shown in FIG. 1) are disposed at least in the pad area 101a, and the other half of the data I/O pins (DQ 16 to DQ 31 in the example shown in FIG. 1) are disposed at least in the pad area 101b. Address pins, command pins, clock pins, power source pins, and the like (not shown) are disposed in the pad area 101c.

The first circuit area 102a has an output buffer for outputting read data to the data I/O pins provided to the pad area 101a, an input receiver for receiving write data supplied via the data I/O pins, and the like. Similarly, the second circuit area 102b has an output buffer for outputting read data to the data I/O pins provided to the pad area 101b, an input receiver for receiving the write data supplied via the data I/O pin, and the like. An address decoder, a command decoder, a DLL (delayed locked loop) circuit, an internal voltage generation circuit, and other peripheral circuits are formed in the third circuit area 102c.

The memory cell area 10 is disposed between the first circuit area 102a and the second circuit area 102b. The memory banks BANK0 through BANK3 provided to the memory cell area 10 are arranged juxtaposed along the Y direction along a line that connects the first circuit area 102a and the second circuit area 102b.

A prescribed circuit provided in the first circuit area 102a, and a prescribed circuit provided in the second circuit area 102b, are connected by a main I/O line MIO formed above the memory banks BANK0 to BANK3, as shown in FIG. 1. Though only one main I/O line MIO is shown in FIG. 1, it is apparent that, in actual practice, numerous main I/O lines MIO are provided in parallel in correspondence to the word size or width used by the device.

Each of the main I/O lines MIO thus connects the first circuit area 102a disposed adjacent or in proximity to the peripheral edge 100a of the semiconductor chip 100, and the second circuit area 102b disposed adjacent or in proximity to the peripheral edge 100b of the semiconductor chip 100. Therefore, the wiring length of the main I/O lines MIO is considerable. Specifically, the main I/O lines MIO have substantially the same length as one side of the semiconductor chip 100 in the Y direction, e.g., on the order of several to tens of millimeters. Therefore, not only is there considerable parasitic capacitance, but also the signal quality of read data on the main I/O line MIO tends to be adversely affected by the differences between the far and near ends. These problems can be efficiently alleviated by an assist circuit described below.

Figure 2:
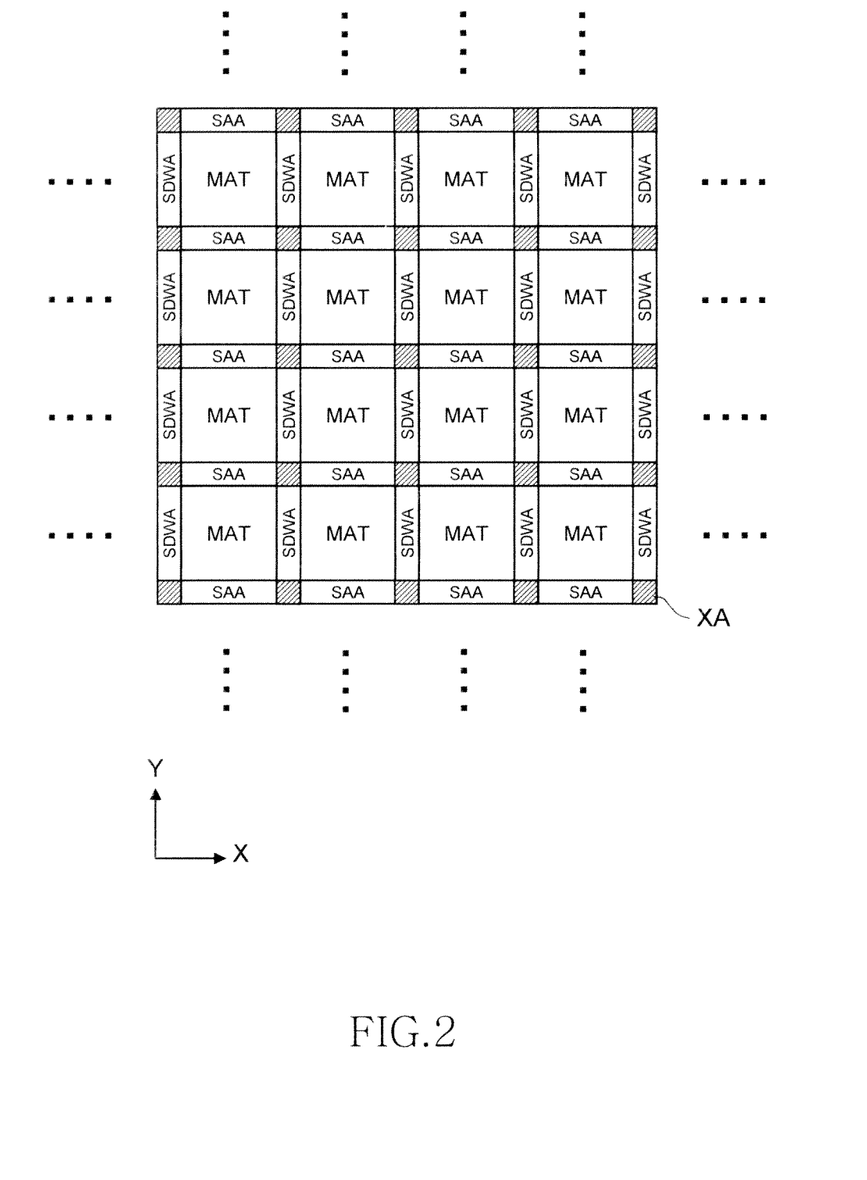
FIG. 2 is a schematic plan view showing an enlarged portion of one of the memory banks.

FIG. 2 is a schematic plan view showing a portion of one of the memory banks in enlarged form.

As shown in FIG. 2, each of the memory banks has a multiplicity or plurality of memory mats MAT arranged in a matrix. The term "memory mat MAT" refers to a range in which a sub word line and a bit line extend. A sub word driver area SWDA is provided between each two adjacent memory mats MAT lying next to each other in the X direction. A sense amplifier area SAA is provided between each two adjacent memory mats MAT lying next to each other in the Y direction.

A cross area XA is provided in a portion of the chip located at the intersection between (i) a column of sub word driver areas SWDA that extend in the Y direction and (ii) a row of sense amplifier areas SAA that extend in the X direction. The cross areas XA are shown hatched in FIG. 2. A driver circuit and the like for driving the main I/O line MIO is disposed in each of the cross areas XA, as described below.

Figure 3:
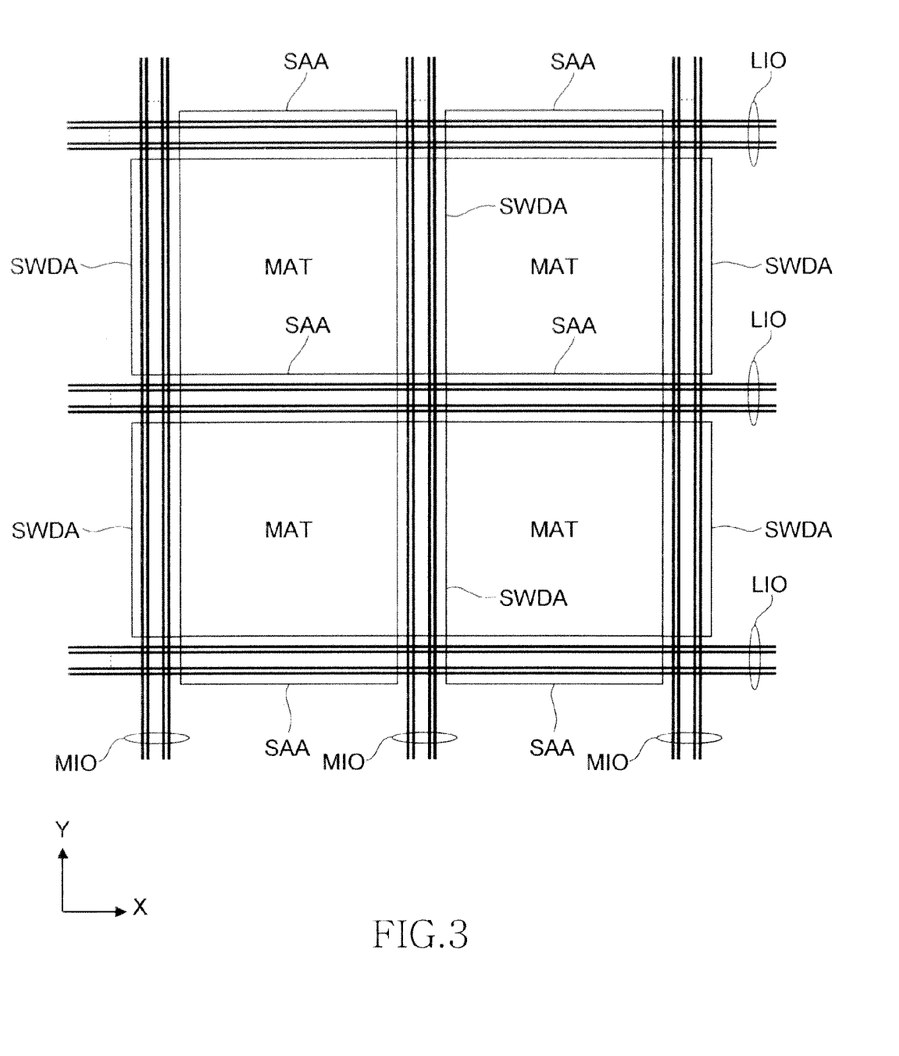
FIG. 3 is a schematic plan view showing a part of each of the memory banks in additionally enlarged form.

FIG. 3 is a schematic plan view showing a part of each of the memory banks in further enlarged.

Local I/O lines LIO are formed on the rows of sense amplifier areas SAA that extend in the X direction, as shown in FIG. 3. The main I/O lines MIO are formed on the column of the sub word driver areas SWDA that extend in the Y direction. The local I/O lines LIO and the main I/O lines MIO are hierarchically structured I/O lines. The local I/O lines LIO are used to perform an operation whereby read data that is stored in and read from a memory cell is transmitted inside the memory cell area 10, and the main I/O lines MIO are used for transmitting the read data from the memory cell area 10 to the peripheral circuit area 20. Specifically, read data amplified by a sense amplifier is first transmitted to the local I/O lines LIO, and is then from there transmitted to the main I/O lines MIO. The main I/O lines MIO are connected to the circuit areas 102a and 102b, and read data transmitted via the main I/O lines MIO is ultimately output from the data I/O pins to the outside, e.g., to an external bus or device, as shown in FIG. 1.

The local I/O lines LIO are differential I/O lines that transmit read data by using a pair of wires or conductors as described below. The main I/O lines MIO are single-ended I/O lines that transmit read data by using a single wire or conductor. The required number of main I/O lines MIO increases with an increasing number of bits in the simultaneously input and output data (i.e., with the data width), and the main I/O lines MIO are therefore configured as single-end lines in order to minimize this increase in the number of lines required.

Figure 4:
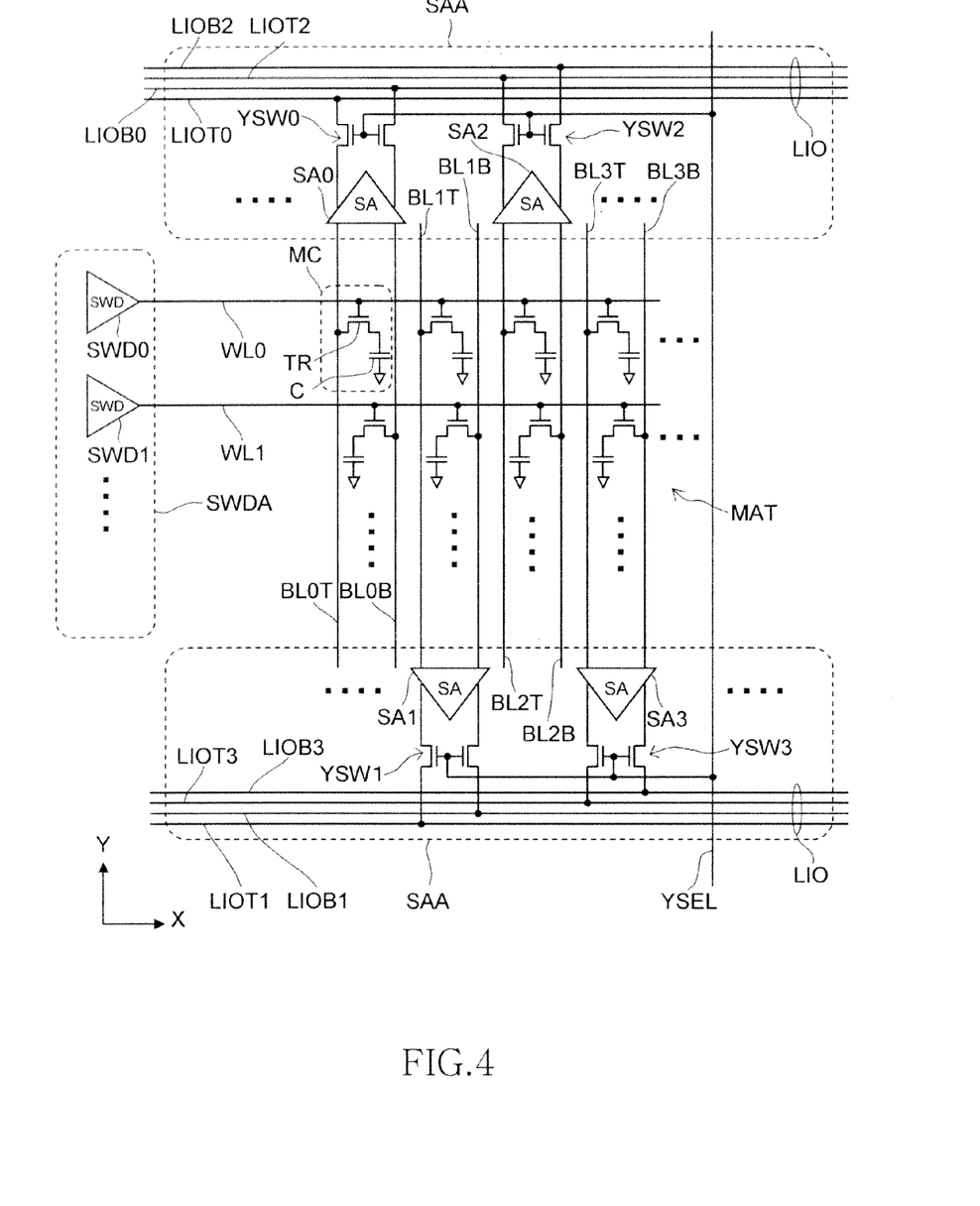
FIG. 4 is a circuit diagram showing a configuration of a memory mat, a sub word driver area, and a sense amplifier area shown in FIGS. 2 and 3.

FIG. 4 is a circuit diagram showing a configuration of a memory mat MAT, a sub word driver area SWDA, and a sense amplifier area SAA.

Multiple sub word drivers SWD0, SWD1, ... are provided to the sub word driver area SWDA, as shown in FIG. 4. Each of the sub word drivers SWD0, SWD1, ... drive an associated one of the sub word lines WL0, WL1, ... on the basis of a row address. That is, the row address is used to select the appropriate sub word line.

Multiple sense amplifiers SA0, SA1, ... and column switches YSW0, YSW1, ... are provided to the sense amplifier area SAA. The sense amplifiers SA0, SA1, ... are connected to the corresponding bit line pairs (e.g., pairs composed of bit lines BL0T, BL0B) and amplify a potential difference appearing in these bit line pairs. The column switches YSW0, YSW1, are provided between the corresponding sense amplifiers and local I/O lines LIO, and are switched to an on state based on a corresponding column selection signal YSEL. For example, the column switch YSW0 is connected between the sense amplifier SA0 and the local I/O lines LIOT0 and LIOB0. Therefore, the sense amplifier SA0 and the local I/O lines LIOT0 and LIOB0 are electrically connected when the column selection signal YSEL is activated, i.e., goes high. The column selection signal YSEL is activated on the basis of a column address.

In the example shown in FIG. 4, a configuration is adopted in which the four column switches YSW0 to YSW3 in the same memory mat MAT are switched by the same column selection signal YSEL, but the present invention is not limited by this configuration alone. Also, in the column switches used in the same memory mat MAT in the example shown in FIG. 4, the even-numbered column switches YSW0, YSW2, ... are disposed in the sense amplifier area SAA positioned on one side (top of FIG. 4) as viewed from the memory mat MAT, and the odd-numbered column switches YSW1, YSW3, ... are disposed in the sense amplifier area SAA positioned on the other (opposite) side (bottom of FIG. 4) as viewed from the memory mat MAT, but the present invention is not limited by this configuration. In the present embodiment, the read data that has been simultaneously selected and passed through the column switches YSW0 to YSW3 is transmitted via a pair of signal lines composed of LIOT0 and LIOB0, a pair of signal lines composed of LIOT1 and LIOB1, a pair of signal lines composed of LIOT2 and LIOB2, and a pair of signal lines composed of LIOT3 and LIOB3, respectively.

Memory cells MC are placed at intersections between the word lines and the bit lines in the memory mat MAT, as shown in FIG. 4. The memory cells MC have a configuration in which a memory cell transistor TR and a memory cell data storage capacitance C are connected in series between the corresponding bit lines and plate (ground or return paths) wirings. The memory cell transistor TR is composed of an N-channel MOS transistor, and the gate electrode thereof is connected to the corresponding word line.

Figure 5:
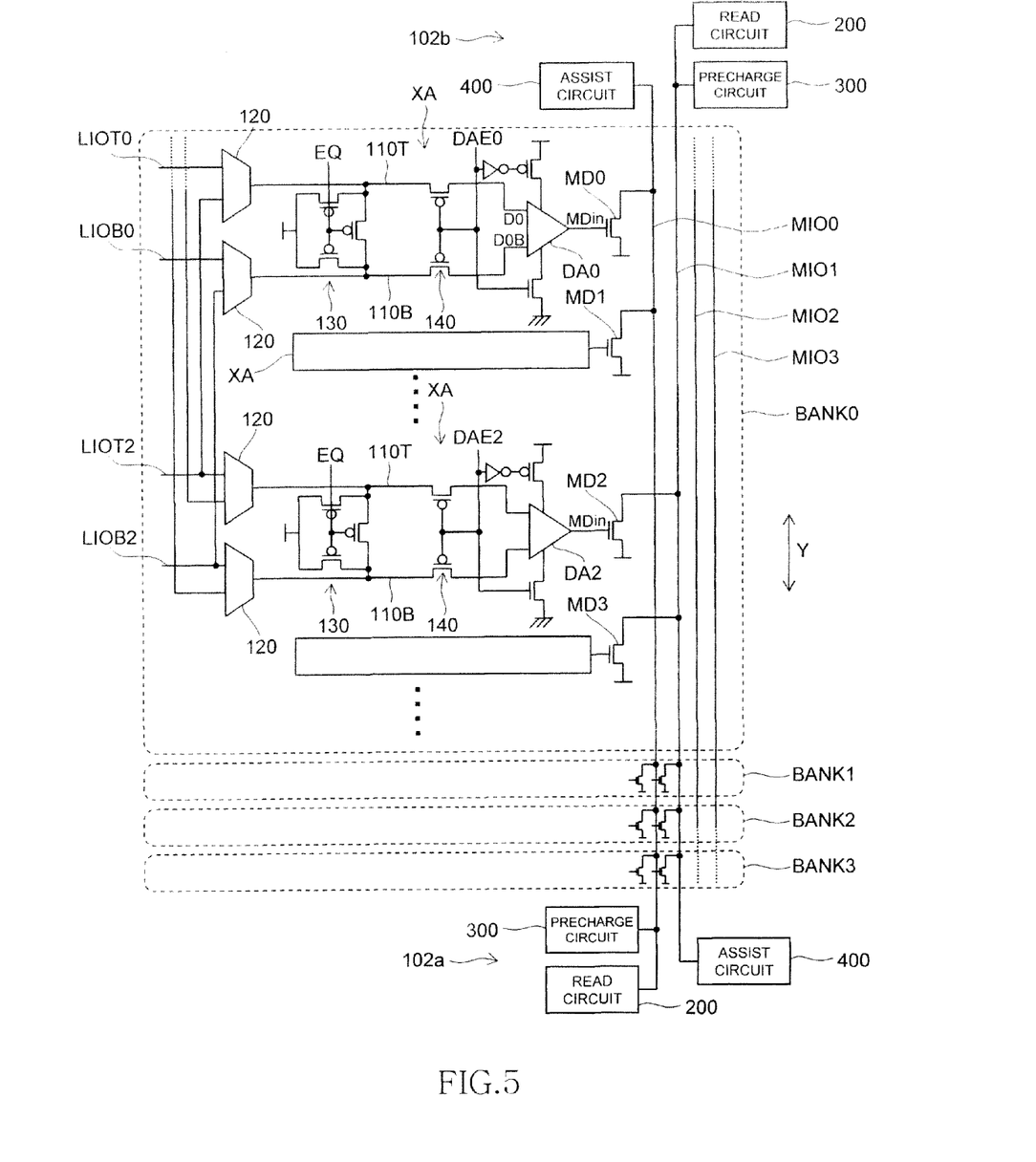
FIG. 5 is a circuit diagram showing a configuration of the main part of a cross area shown in FIG. 2.

FIG. 5 is a circuit diagram showing the configuration of the main part of a cross area XA.

A single cross area XA includes a multiplexer 120, an equalizer 130 for equalizing a pair of internal wirings 110T and 110B, a data amplifier DA0 for receiving the potential difference of the pair of internal wirings 110T and 110B, and a driver circuit MD0 for receiving an output MDin of the data amplifier DA0, as shown in FIG. 5.

The multiplexer 120 is a switching circuit for connecting the pair of internal wirings 110T and 110B to any of the local I/O lines LIO. For example, in the cross area XA provided with the data amplifier DA0 and the driver circuit MD0, either the local I/O lines LIOT0 and LIOB0, or the local I/O lines LIOT2, LIOB2 are connected to the pair of internal wirings 110T and 110B. The selection is performed on the basis of and in response to the column address.

The equalizer 130 is composed of three P-channel MOS transistors. When an equalize signal EQ is activated (changed to a low level), the pair of internal wirings 110T and 110B is equalized to the same electric potential.

The data amplifier DA0 is an amplifier activated when an enable signal DAE0 is raised to a high level (e.g., goes high). When the enable signal DAE0 goes high, a pair of input nodes of the data amplifier DA0 and the equalizer 130 is disconnected by a gate circuit 140, and the pair of internal wirings 110T and 110B is thereby allowed to perform the next equalizing operation. The gate circuit 140 is configured from a P-channel MOS transistor, as shown in FIG. 5. On the other hand, when the enable signal DAE0 is at a low level, the gate circuit 140 is switched on, and the power supply to the data amplifier DA0 is interrupted. The output MDin of the data amplifier DA0 is thereby maintained at a low level.

The driver circuit MD0 is configured from an N-channel MOS transistor, and the output signal MDin of the data amplifier DA0 is supplied to the gate electrode thereof. The source of the transistor that constitutes the driver circuit MD0 is connected to a prescribed power source potential (e.g., ground potential), and the drain is connected to the main I/O line MIO0. This configuration allows the driver circuit MD0 to discharge the main I/O lines MIO when the output MDin of the data amplifier DA0 is at a high level, and has no effect on the main I/O lines MIO when the output MDin of the data amplifier DA0 is at a low level.

The above-described circuit is formed in each prescribed cross area XA, and drives each of the corresponding main I/O lines MIO0, MIO1, .... As described above, the main I/O lines MIO are provided so as to go across and span the memory banks BANK0 to BANK3, with a single main I/O line MIO shared by these four memory banks BANK0 to BANK3. One end of each of the main I/O lines MIO is connected to the first circuit area 102a, and the other end is connected to the second circuit area 102b.

Among the plural main I/O lines, one end of the main I/O line MIO0 is connected to a read circuit 200 and a precharge circuit 300 formed on the first circuit area 102a, and the other end is connected to an assist circuit 400 formed on the second circuit area 102b, as shown in FIG. 5. Conversely, one end of the main I/O line MIO1 is connected to a read circuit 200 and a precharge circuit 300 formed on the second circuit area 102b, and the other end is connected to an assist circuit 400 formed on the first circuit area 102a.

The read circuit 200 is a circuit for receiving the read data in the main I/O lines MIO. Therefore, for purposes of reference with respect to the main I/O line MIO0, the memory bank BANK0 is located at the far end (i.e., farthest from the associated read circuit 200 depicted at the bottom of FIG. 4), and the memory bank BANK3 is located at the near end (i.e., closest to read circuit 200). Conversely, with respect to the main I/O line MIO1, the memory bank BANK3 is located at the far end (farthest from associated read circuit 200), and memory bank BANK0 is located at the near end (closest to the associated read circuit 200). The configuration of the read circuit 200 is described below.

The precharge circuit 300 is a circuit for precharging the main I/O lines MIO discharged by the driver circuit MD0. The precharge circuit 300 also has the function of supplying the write data to the main I/O lines MIO during a write operation. The configuration of the precharge circuit 300 is further described below.

The assist circuit 400 is a circuit for amplifying the read data in the main I/O lines MIO, and has the function of minimizing loss of signal quality of read data caused by electrical difference between the far end and near end of the I/O line. The assist circuit 400 is connected to the ends of the main I/O lines MIO that are on the side opposite from the associated read circuit 200, i.e., is connected to the most distant or far end.

When the assist circuit 400 is absent, the waveform of read data supplied to the read circuit 200 varies considerably between those situations in which the main I/O lines MIO are discharged using a driver circuit connected near or at the near end, and those situations in which the main I/O lines MIO are discharged using a driver circuit connected near or at the far end. Specifically, the further the driver circuit for discharging the main I/O lines MIO is from the read circuit 200, the more time it takes for the settled signal to propagate until the read circuit 200 receives the stabilized read data.

However, in the present embodiment, the assist circuit 400 is connected to the farthest ends of the main I/O lines. Therefore, amplification by the assist circuit 400 is performed progressively faster at points located closer to the far ends of the main I/O lines MIO, and the difference between the far end and near end can be efficiently reduced. The configuration of the assist circuit 400 is further described below.

Figure 6:
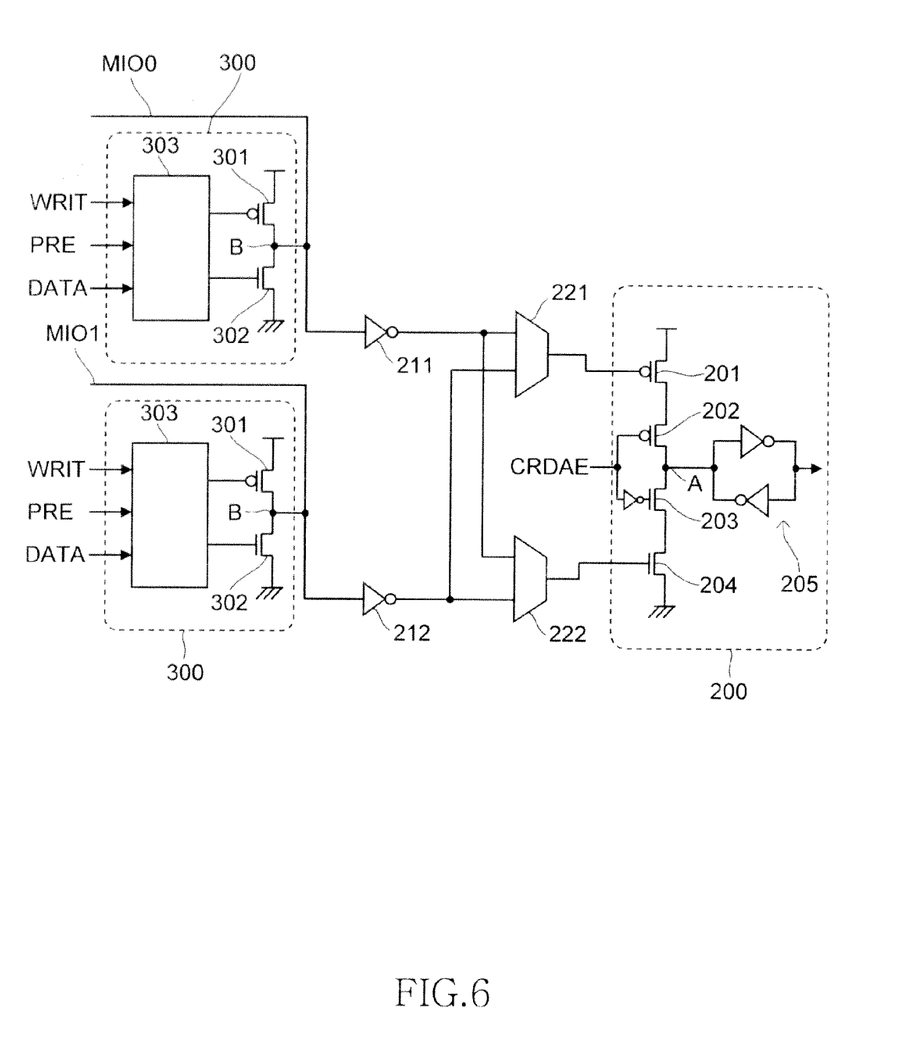
FIG. 6 is a circuit diagram of a read circuit and a precharge circuit shown in FIG. 5.

FIG. 6 is a circuit diagram of the read circuit 200 and the precharge circuit 300.

Two main I/O lines MIO0 and MIO1 are connected to a single read circuit 200 via inverters 211 and 212 and multiplexers 221 and 222, as shown in FIG. 6. The multiplexers 221 and 222 are selected on the basis of a column address. The read circuit 200 has serially connected transistors 201 to 204, and further has a latch circuit 205 for latching the logical level of the connection point A of transistors 202 and 203. Both of the transistors 201 and 202 are P-channel MOS transistors, and both of the transistors 203 and 204 are N-channel MOS transistors.

An enable signal CRDAE and an inverted signal thereof (i.e., its complementary signal) are supplied to the gate electrodes of the transistors 202 and 203, respectively. Each of the transistors 202 and 203 can thereby be switched on when the enable signal CRDAE is at a low level, and the potential of the connection point A is determined by the logic level of the main I/O line MIO0 or MIO1. In a case in which, for example, the multiplexers 221 and 222 select the main I/O line MIO0, the connection point A is at a high level because a low level is applied to the gate electrodes of each of the transistors 201 and 204 if the read data in the main I/O line MIO is at the high level. Conversely, a high level is applied to the gate electrodes of both of the transistors 201 and 204 if the read data in the main I/O line MIO is at a low level, and the connection point A is therefore at a low level.

The logic level of the connection point A is latched by the latch circuit 205. The read data latched by the latch circuit 205 is output via a read/write bus or the like (not shown) from a data I/O pin provided to a pad area 100a or 100b. The content of the latch circuit 205 is retained at least during a period in which the enable signal CRDAE is at a high level.

Each precharge circuit 300 is composed of serially connected transistors 301 and 302 and a control circuit 303 for controlling the transistors 301 and 302. The transistor 301 is a P-channel MOS transistor, and the transistor 302 is an N channel MOS transistor, as shown in FIG. 6. The connection points B of the transistors 301 and 302 are connected to the corresponding main I/O lines MIO.

Each of the control circuits 303 receives a write signal WRIT, a precharge signal PRE, and write data DATA so as to control the transistors 301 and 302 based on the combinations of these signals. The write signal WRIT is activated to a high level during a write operation, and the precharge signal PRE is activated to a high level during a precharge operation of the corresponding main I/O line MIO.

Figure 7:
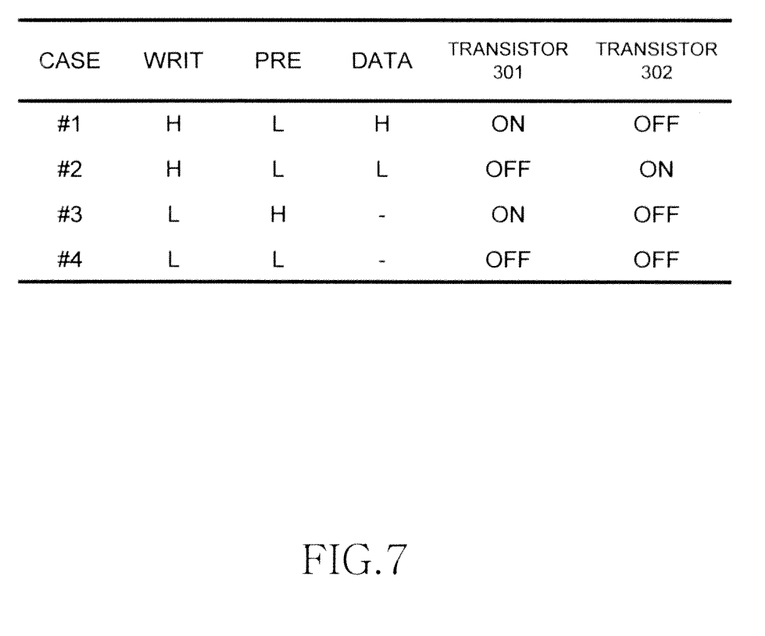
FIG. 7 is a truth table describing operation of a control circuit shown in FIG. 6.

FIG. 7 is a logic or truth table describing operation of the control circuit 303.

Case #1 in FIG. 7 is one in which high-level data is written to a memory cell, where the transistor 301 is switched on, and the transistor 302 is switched off. The main I/O line MIO is thereby driven to a high level via the transistor 301. Case #2 is one in which low-level data is written to a memory cell, where the transistor 301 is switched off, and the transistor 302 is switched on. The main I/O line MIO is thereby driven to a low level via the transistor 302. Case #3 is one in which the main I/O line MIO is pre-charged, where the transistor 301 is switched on, and the transistor 302 is switched off. The main I/O line MIO is thereby pre-charged via the transistor 302. Case #4 is one in which a read operation is performed by a read circuit 200, where both the transistors 301 and 302 are switched off. The main I/O line MIO is thereby disconnected from the precharge circuit 300.

Figure 8:
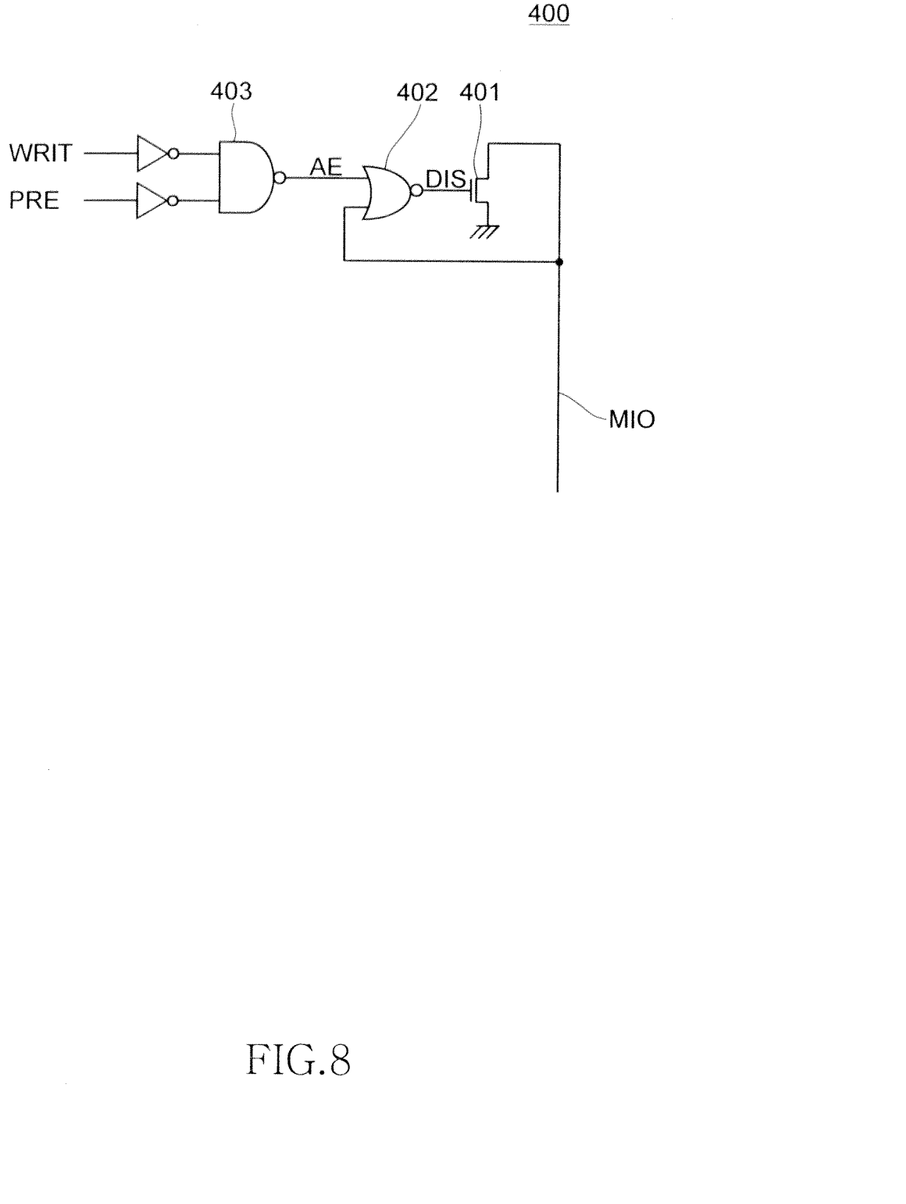
FIG. 8 is a circuit diagram of an assist circuit shown in FIG. 5.

FIG. 8 is a circuit diagram of the assist circuit 400.

As shown in FIG. 8, the assist circuit 400 has an N-channel MOS transistor 401 with its drain connected to the furthest end of the main I/O line MIO and source connected to a prescribed power source potential (e.g., ground potential), and further has a NOR circuit 402 for receiving an assist enable signal AE and the read data in the main I/O line MIO so as to generate a discharge signal DIS that is supplied to the gate electrode of the transistor 401.

The assist enable signal AE is an output signal of a NAND circuit 403. An inverted signal of the write signal WRIT and an inverted signal of the precharge signal PRE are supplied to the NAND circuit 403, as shown in FIG. 8. The assist enable signal AE is therefore activated to a low level when both the write signal WRIT and the precharge signal PRE reach the low level. As described with reference to FIG. 7, this condition corresponds to a read operation performed by the read circuit 200 such that both the write signal WRIT and the precharge signal PRE reach a low level (case #4).

Figure 9:
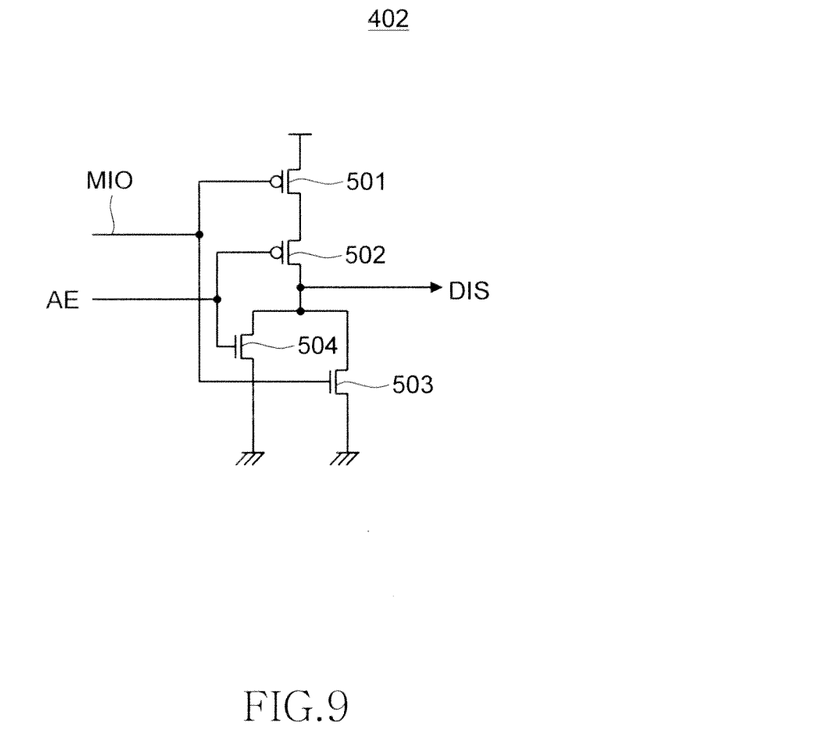
FIG. 9 is a circuit diagram of an NOR circuit shown in FIG. 8.

When the assist enable signal AE is activated to a low level, the NOR circuit 402 brings the discharge signal DIS to a high level and switches on the transistor 401 in response to a drop in the potential of the main I/O line MIO to a potential level below a prescribed threshold value. A discharge of the main I/O line MIO is thereby accelerated. As used herein, the term "prescribed threshold value" refers to the threshold switching value of the transistors constituting the NOR circuit 402. Specifically, the NOR circuit 402 has the circuit configuration shown in FIG. 9. In this circuit, threshold values of the transistors 501 and 503 are the prescribed threshold value. An assist enable signal AE is supplied to the gate electrodes of the other transistors 502 and 504. As shown in FIG. 9, the transistors 501 and 502 are P-channel MOS transistors, and the transistors 503 and 504 are N-channel MOS transistors.

Thus, the read data transmitted through the main I/O line MIO is amplified when the potential of the main I/O line MIO drops below the threshold value of the transistors 501 and 503 in a case in which the assist enable signal AE is at a low level.

By contrast, one of the write signal WRIT and precharge signal PRE is at a high level during a write operation (cases #1, #2) or during a precharge operation (case #3). The assist enable signal AE is therefore at a high level, and the discharge signal DIS which is the output of the NOR circuit 402 is fixed at a low level. As a result, the transistor 401 is brought to a nonconductive off state (i.e., turns off). The assist circuit 400 is thus deactivated during a write operation or during a precharge operation, and there is no effect on the main I/O line MIO.

The structure of a semiconductor memory device according to the present embodiment was described above. Thus, in the semiconductor memory device according to the present embodiment, a main I/O line MIO can be rapidly discharged because an assist circuit 400 is connected to the far end of the main I/O line MIO. A method involving the use of a larger driver circuit MD can also be suggested here as a method for rapidly discharging the main I/O line MIO. However, since driver circuits MD are installed at each of the large number of cross areas XA within a memory cell area 10, chip size will dramatically increase if each of the driver circuits MD is made larger to increase its I/O line discharge rate. By contrast, the chip size is only minimally affected in the present embodiment because merely providing an assist circuit 400 to a peripheral circuit area 20 is sufficient to mitigate I/O line signal propagation delays in devices having long I/O lines, rather than increasing the size of each individual driver circuit MD.

It is difficult to reduce the electric potential of a main I/O line MIO to the ground level in cases in which the main I/O line MIO is discharged by a driver circuit MD alone. By contrast, the electric potential of the main I/O line MIO can be rapidly reduced to the ground level in the present embodiment by the operation of the assist circuit 400. The read circuit 200 connected to the main I/O line MIO can therefore latch read data by a sufficient latch margin.

Operation of the semiconductor memory device according to the present embodiment will now be described with reference to a timing chart.

Figure 10:
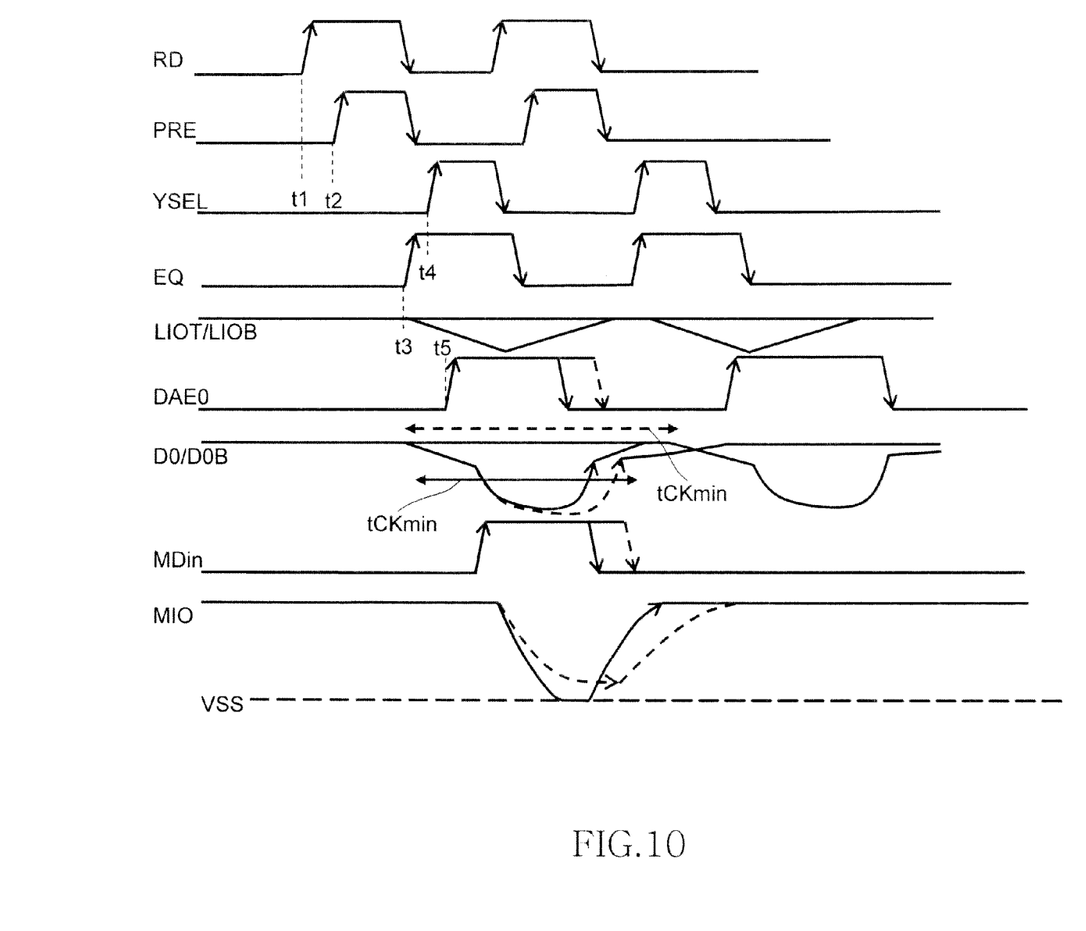
FIG. 10 is a timing chart showing the operation performed during a read operation in the semiconductor memory device according to the preferred embodiment of the present invention.

FIG. His a timing chart showing the operation performed during a read operation in the semiconductor memory device according to the present embodiment.

First, the selected memory bank starts a read operation based on a row address when an internal read command RD is activated at time t1. A precharge signal PRE is activated at a high level at time t2. Although this is not shown in FIG. 10, the write signal WRIT is kept at a low level during the read operation. The main I/O line MIO is thereby pre-charged because the transistor 301 shown in FIG. 6 turns on. The equalize signal EQ is kept at a low level during this period, and the pair of internal wirings 110T and 110B shown in FIG. 5 is therefore equalized to the same electric potential.

The equalize signal EQ is "deactivated" to a high level at time t3, and a prescribed column selection signal YSEL is activated at time t4 when the read operation based on the row address is completed and the pre-charging of the main I/O line MIO is completed. A selection is made based on a column address as to which column selection signal YSEL should be activated. The local I/O lines LIOT0 and LIOB0 shown in FIG. 4 are thereby driven by a prescribed sense amplifier SA, and the potential difference between the local I/O lines LIOT0 and LIOB0 gradually expands.

After the potential difference between the local I/O lines LIOT0, LIOB0 is sufficiently expanded (i.e., there is a sufficient differential voltage potential across the lines), the enable signal DAE0 is activated to a high level at time t5. A potential difference is provided to the signal DO/DOB that is input to a data amplifier DA0, and a change is induced in the output signal MDin of the data amplifier DA0 to switch on the drive circuit MD0 (or to keep the circuit in an off state) at time t5. It is determined by the logic level of read data whether the drive circuit MD0 is switched on or is maintained in an off state.

When the drive circuit MD0 is switched on, the pre-charged main I/O line MIO0 is discharged via the drive circuit MD0, and the electric potential thereof decreases. When the electric potential of the main I/O line MIO0 falls below a prescribed threshold value, the transistor 401 in the assist circuit 400 shown in FIG. 8 is switched on, and the discharging of the main I/O line MIO0 is accelerated. The I/O line MIO0 is thereby discharged rapidly.

Although not shown in FIG. 10, the enable signal CRDAE is then activated to a low level, and the read data is thereby latched by the latch circuit 205 in the read circuit 200.

When the main I/O line MIO0 is thus discharged by the drive circuit MD0 in the present embodiment, the discharge is assisted by the assist circuit 400, and the main I/O line MIO0 can be rapidly discharged. The read data appearing in the read circuit 200 can therefore be promptly established even in these cases in which the drive circuit MD0 is positioned at the distant end, as viewed from the read circuit 200.

The waveforms are also shown by broken lines in FIG. 10 for a case in which the assist circuit 400 is absent. As is shown by the broken lines in FIG. 10, the electric potential decreases relatively slowly and establishment of read data is also slow in the absence of the assist circuit 400 because the main I/O line MIO is discharged by the drive circuit MD0 alone. This problem is particularly pronounced in cases in which the drive circuit MD0 is positioned at the distant end, as viewed from the read circuit 200.

By contrast, in the semiconductor memory device according to the present embodiment, an assist circuit 400 is provided at the distant end, as viewed from the read circuit 200, and the above-described effects can therefore be obtained.

The present invention is in no way limited to the aforementioned embodiments, but rather various modifications are possible within the scope of the invention as recited in the claims, and naturally these modifications are included within the scope of the invention.

Figure 11A:
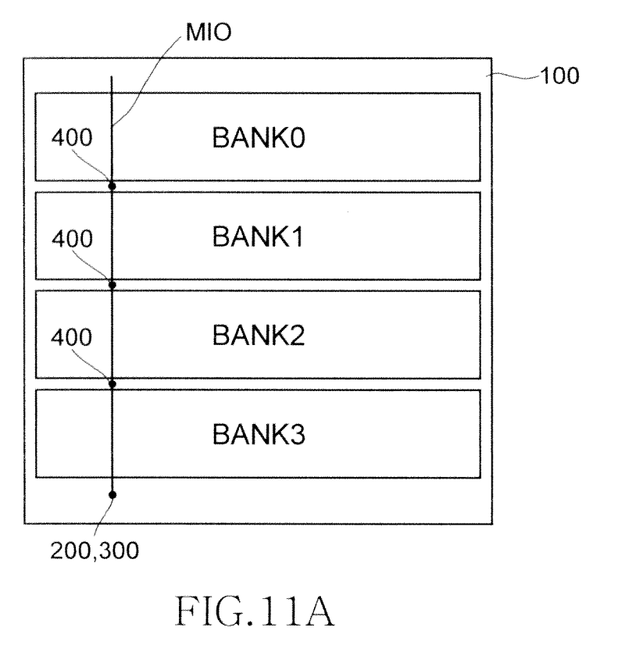
FIG. 11A is a schematic plan view showing a modified embodiment of a memory.
Figure 11B:
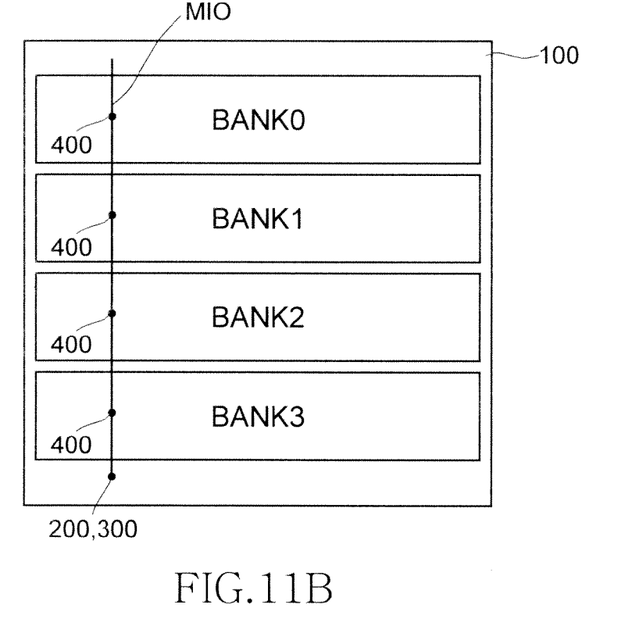
FIG. 11B is a schematic plan view showing another modified embodiment of a memory.

In the above-described embodiment, a single assist circuit 400 is, for example, connected to the farthest end of a main I/O line MIO, but the connection position of the assist circuit is not limited to this option alone, and the position may be farther away from a prescribed drive circuit included in a plurality of drive circuits, as viewed from the read circuit 200. In addition, there is no limit on the number of assist circuits connected to a single main I/O line MIO. Therefore, a plurality of assist circuits 400 may be disposed between adjacent memory banks, as shown in FIG. 11A; or an assist circuit 400 may be disposed within each of the memory banks, as shown in FIG. 11B. It is most effective, however, to connect an assist circuit 400 to the farthest end of the main I/O line MIO in order to reduce the difference between the far end and near end, as in the embodiment described above.

A case was also described in the above embodiment as an example in which a peripheral circuit area 20 was laid out in a peripheral edge of a semiconductor chip 100, but the layout of the semiconductor memory device according to the present invention is not limited to this option alone. The present invention can therefore be used in cases in which a peripheral circuit area is disposed in a center portion of a semiconductor chip, as in a large number of DRAMs. In a case in which the peripheral circuit area is disposed in a peripheral edge of the semiconductor chip 100, as in the above-described embodiment, applying the present invention to a semiconductor memory device having such a layout is the most effective because of the extremely long wiring of the main I/O lines MIO.

In the above-described embodiment, an assist circuit 400 is also connected to the main I/O lines for connecting memory cell areas and peripheral circuit areas, which are some of the hierarchically structured I/O lines, but the present invention is not limited to this option alone. Therefore, it is not necessary for the I/O lines to be hierarchically structured, and an assist circuit can be connected to any of the I/O lines. As described above, however, the main I/O lines for connecting memory cell areas and peripheral circuit areas have a particularly long wiring length, and connecting the assist circuit to such I/O lines therefore produces the greatest effect and advantage.

Further, an I/O line for connecting the assist circuit is not limited to a single-ended I/O line, and the assist circuit may also be connected to a differential I/O line. However, since a single-ended I/O line requires greater signal amplitude than does a differential I/O line, so that connecting the assist circuit to a single-ended I/O line, as in the above-described embodiment, is therefore particularly effective.

What is claimed is:

1. A semiconductor device comprising:
a pair of first data lines transferring complementary signals;
a second data line;
a first circuit coupled with the pair of first data lines to generate a control signal from the complementary signals;
a second circuit driving the second data line from a first potential level to a second potential level in response to the control signal; and
a third circuit driving the second data line from the first potential level to the second potential level in parallel to the second circuit in response to a potential level of the second data line exceeding a prescribed value.

2. The device as claimed in claim 1, further comprising a memory cell, wherein the complementary signals transmitted by the pair of first data lines is read out from the memory cell.

3. The device as claimed in claim 2, further comprising a sense amplifier amplifying the complementary signals on the pair of first data lines.

4. The device as claimed in claim 3, wherein the second data line is a single-ended data line.

5. The device as claimed in claim 2, wherein the second data line is a single-ended data line.

6. The device as claimed in claim 1, further comprising a fourth circuit coupled to the second data line to amplify the potential level of the second data line.

7. The device as claimed in claim 6, wherein the fourth circuit is connected to an end of the second data line, and the third circuit is connected to the other end of the second data line.

8. The device as claimed in claim 6, wherein the fourth circuit comprises a latch circuit for latching the logic level transmitted through the second data line.

9. The device as claimed in claim 1, further comprising a fifth circuit operative to precharge the second data line to the first potential level.

10. The device as claimed in claim 9, wherein the second data line is a single-ended data line.

11. The device as claimed in claim 1, wherein
the second circuit includes an MIS transistor; and
the second circuit receives the control signal with a gate terminal of the MIS transistor.

12. The device as claimed in claim 11, wherein one of source and drain terminals of the MIS transistor is connected to the second data line.

13. The device as claimed in claim 11, wherein the MIS transistor comprises an n-channel MIS transistor.

14. The device as claimed in claim 1, wherein the second data line is a single-ended data line.

15. A method comprising:
providing complementary signals onto a pair of first data lines;
generating a control signal from the complementary signals;
driving a second data line from a first potential level to a second potential level in response to the control signal; and
supplementing the driving the second data line from the first potential level to the second potential level in response to a potential level of the second data line exceeding a prescribed value.

16. The method as claimed in claim 15, further comprising reading, before the providing the complementary signals; the complementary signals from a memory cell.

17. The method as claimed in claim 16, further comprising amplifying, before the generating the control signal, the complementary signals on the pair of first data lines.

18. The method as claimed in claim 15, further comprising amplifying the potential level of the second data line.

19. The method as claimed in claim 18, wherein the amplifying the potential level of the second data line is carried out at an end of the second data line, and the supplementing the driving is carried out at the other end of the second data line.

20. The method as claimed in claim 18, further comprising latching, after the amplifying the potential level of the second data line, the potential level of the second data line.

21. The method as claimed in claim 15, further comprising precharging, before the driving the second data line, the second data line to the first potential level.

22. The method as claimed in claim 15, wherein the driving the second data line comprises receiving the control signal with a gate terminal of an MIS transistor.

23. The method as claimed in claim 22, wherein one of source and drain terminals of the MIS transistor is connected to the second data line.

24. The method as claimed in claim 22, wherein the MIS transistor comprises an n-channel MIS transistor.

* * * * *